(12) United States Patent
Sha et al.

(10) Patent No.: US 10,706,200 B2
(45) Date of Patent: Jul. 7, 2020

(54) GENERATIVE ADVERSARIAL NETWORKS FOR GENERATING PHYSICAL DESIGN LAYOUT PATTERNS OF INTEGRATED MULTI-LAYERS

(71) Applicant: International Business Machines Corporation, Armonk, NY (US)

(72) Inventors: Jing Sha, White Plains, NY (US); Michael A. Guillorn, Cold Springs, NY (US); Martin Burkhardt, White Plains, NY (US); Derren N. Dunn, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 16/000,243

(22) Filed: Jun. 5, 2018

(65) Prior Publication Data

US 2019/0370432 A1 Dec. 5, 2019

(51) Int. Cl.
*G06F 30/39* (2020.01)
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC .. G06N 3/088; G06N 3/0454; G06F 17/5077; G06F 2217/12; G06F 17/5081; G06F 2217/02

(Continued)

(56) References Cited

U.S. PATENT DOCUMENTS 7,930,667 B2  4/2011  Bergman Reuter et al.
9,122,828 B2  9/2015  Chiang et al.
(Continued)

OTHER PUBLICATIONS

U.S. Appl. No. 15/994,598 filed in the name of J. Sha et al. filed May 31, 2018 and entitled "Coordinates Based Generative Adversarial Networks for Generating Synthetic Physical Design Layout Patterns."

(Continued)

*Primary Examiner* — Sun J Lin
(74) *Attorney, Agent, or Firm* — Vazken Alexanian; Ryan, Mason & Lewis, LLP

(57) ABSTRACT

A method for generating physical design layout patterns includes selecting as training data one or more physical design layout patterns of integrated multi-layers for features in at least two layers of a given patterned structure. The method also includes converting the physical design layout patterns into three-dimensional arrays, a given three-dimensional array comprising a set of two-dimensional arrays each representing features of one layer of the layers in a given one of the physical design layout patterns. The method further includes training, utilizing the three-dimensional arrays, a generative adversarial network (GAN) comprising a discriminator neural network and a generator neural network. The method further includes generating synthetic three-dimensional arrays utilizing the generator neural network of the trained GAN, a given synthetic three-dimensional array comprising a set of two-dimensional arrays each representing features for a new layer of a new physical design layout pattern.

25 Claims, 10 Drawing Sheets

(58) Field of Classification Search
USPC .......................................... 716/100, 101, 110
See application file for complete search history.

(56) References Cited

U.S. PATENT DOCUMENTS

| | | | |
|---|---|---|---|
| 9,626,459 | B2 | 4/2017 | Agarwal et al. |
| 2015/0286766 | A1 | 10/2015 | Singh et al. |
| 2016/0180263 | A1 | 6/2016 | Mourra |
| 2016/0328644 | A1 | 11/2016 | Lin et al. |
| 2016/0378902 | A1* | 12/2016 | Graur et al. ......... G06F 17/5081 716/52 |
| 2017/0357911 | A1* | 12/2017 | Liu et al. ............. G06F 17/5068 |
| 2018/0275523 | A1 | 9/2018 | Biafore et al. |
| 2018/0285510 | A1 | 10/2018 | Lutich |
| 2018/0293205 | A1 | 10/2018 | Koker et al. |
| 2018/0300434 | A1 | 10/2018 | Hu et al. |
| 2019/0138847 | A1* | 5/2019 | Shor et al. ........... G06K 9/6253 |
| 2019/0139641 | A1* | 5/2019 | Itu et al. ................ G16H 30/20 |
| 2019/0147134 | A1* | 5/2019 | Wang et al. .............. G03F 1/36 716/52 |
| 2019/0147320 | A1 | 5/2019 | Mattyus et al. |
| 2019/0188537 | A1* | 6/2019 | Dutta et al. ........... G06K 9/6262 |
| 2019/0204755 | A1 | 7/2019 | Kicken et al. |
| 2019/0220652 | A1* | 7/2019 | Li et al. .................. G06F 21/32 |
| 2019/0228051 | A1 | 7/2019 | Langhammer et al. |
| 2019/0266479 | A1 | 8/2019 | Singh et al. |
| 2019/0266485 | A1 | 8/2019 | Singh et al. |
| 2019/0266784 | A1 | 8/2019 | Singh et al. |

OTHER PUBLICATIONS

U.S. Appl. No. 16/005,999 filed in the name of J. Sha et al. filed Jun. 12, 2018 and entitled "Generative Adversarial Networks for Generating Physical Design Layout Patterns."

List of IBM Patents or Patent Applications Treated as Related.

A. Hamouda et al., "Enhanced OPC Recipe Coverage and Early Hotspot Detection Through Automated Layout Generation and Analysis," Proceedings of SPIE, Optical Microlithography XXX, Mar. 24, 2017, 9 pages, vol. 10147.

J.-W. Jeon et al., "Early Stage Hot Spot Analysis Through Standard Cell Base Random Pattern Generation," Proceedings of SPIE, Design-Process-Technology Co-optimization for Manufacturability XI, Apr. 4, 2017, 7 pages, vol. 10148.

Andrey Lutich, "PatterNet: A System to Learn Compact Physical Design Pattern Representations for Pattern-Based Analytics," Journal of Micro/Nanolithography, MEMS, and MOEMS, Jul.-Sep. 2017, 7 pages, vol. 16, No. 3.

T.G. Neogi et al., "Design Space Analysis of Novel Interconnect Constructs for 22NM FDX Technology," Proceedings of SPIE, Design-Process-Technology Co-optimization for Manufacturability XI, Mar. 30, 2017, 7 pages, vol. 10148.

I.J. Goodfellow et al., "Generative Adversarial Nets," Proceedings of the 27th International Conference on Neural Information Processing Systems (NIPS), Dec. 8-13, 2014, pp. 2672-2680, vol. 2.

A. Radford et al., "Unsupervised Representation Learning with Deep Convolutional Generative Adversarial Networks," arXiv preprint arXiv:1511.06434, Nov. 19, 2015, 16 pages.

* cited by examiner

GENERATIVE ADVERSARIAL NETWORKS FOR GENERATING PHYSICAL DESIGN LAYOUT PATTERNS OF INTEGRATED MULTI-LAYERS

BACKGROUND

The present application relates to semiconductor manufacturing, and more specifically, to techniques for patterning in semiconductor manufacturing. Patterned structures may include single layer and multi-layer structures. Each layer of a patterned structure may include a number of vias, lines and various other features. Generating and expanding layout pattern libraries for these and other features is useful for evaluating manufacturability.

SUMMARY

Embodiments of the invention provide techniques for generating synthetic multi-layer integrated physical layout patterns.

In one embodiment, a method for generating physical design layout patterns of integrated multi-layers comprises the step of selecting as training data one or more physical design layout patterns of integrated multi-layers for features in at least two layers of a given patterned structure. The method also comprises the step of converting the physical design layout patterns of integrated multi-layers into three-dimensional arrays, a given three-dimensional array comprising a set of two-dimensional arrays each representing features of one of the at least two layers in a given one of the physical design layout patterns of integrated multi-layers. The method further comprises the step of training, utilizing the three-dimensional arrays, a generative adversarial network (GAN) comprising a discriminator neural network and a generator neural network. The method further comprises the step of generating one or more synthetic three-dimensional arrays utilizing the trained generator neural network of the GAN, a given one of the synthetic three-dimensional arrays comprising a set of two-dimensional arrays each representing features for one of at least two new layers of a new physical design layout pattern of integrated multi-layers. The method is performed by at least one processing device comprising a processor coupled to a memory.

In another embodiment, a computer program product comprises a computer readable storage medium having program instructions embodied therewith. The program instructions are executable by at least one computing device to cause the at least one computing device to perform the step of selecting as training data one or more physical design layout patterns of integrated multi-layers for features in at least two layers of a given patterned structure. The program instructions are executable by the at least one computing device to cause the at least one computing device to also perform the step of converting the physical design layout patterns of integrated multi-layers into three-dimensional arrays, a given three-dimensional array comprising a set of two-dimensional arrays each representing features of one of the at least two layers in a given one of the physical design layout patterns of integrated multi-layers. The program instructions are executable by the at least one computing device to cause the at least one computing device to further perform the step of training, utilizing the three-dimensional arrays, a GAN comprising a discriminator neural network and a generator neural network. The program instructions are executable by the at least one computing device to cause the at least one computing device to also perform the step of generating one or more synthetic three-dimensional arrays utilizing the trained generator neural network of the GAN, a given one of the synthetic three-dimensional arrays comprising a set of two-dimensional arrays each representing features for one of at least two new layers of a new physical design layout pattern of integrated multi-layers.

In another embodiment, an apparatus comprises a memory and at least one processor coupled to the memory. The processor is configured for selecting as training data one or more physical design layout patterns of integrated multi-layers for features in at least two layers of a given patterned structure. The processor is also configured for converting the physical design layout patterns of integrated multi-layers into three-dimensional arrays, a given three-dimensional array comprising a set of two-dimensional arrays each representing features of one of the at least two layers in a given one of the physical design layout patterns of integrated multi-layers. The processor is further configured for training, utilizing the three-dimensional arrays, a GAN comprising a discriminator neural network and a generator neural network. The processor is further configured for generating one or more synthetic three-dimensional arrays utilizing the trained generator neural network of the GAN, a given one of the synthetic three-dimensional arrays comprising a set of two-dimensional arrays each representing features for one of at least two new layers of a new physical design layout pattern of integrated multi-layers.

These and other objects, features and advantages of the present invention will become apparent from the following detailed description of illustrative embodiments thereof, which is to be read in connection with the accompanying drawings.

DETAILED DESCRIPTION

Figure 1:
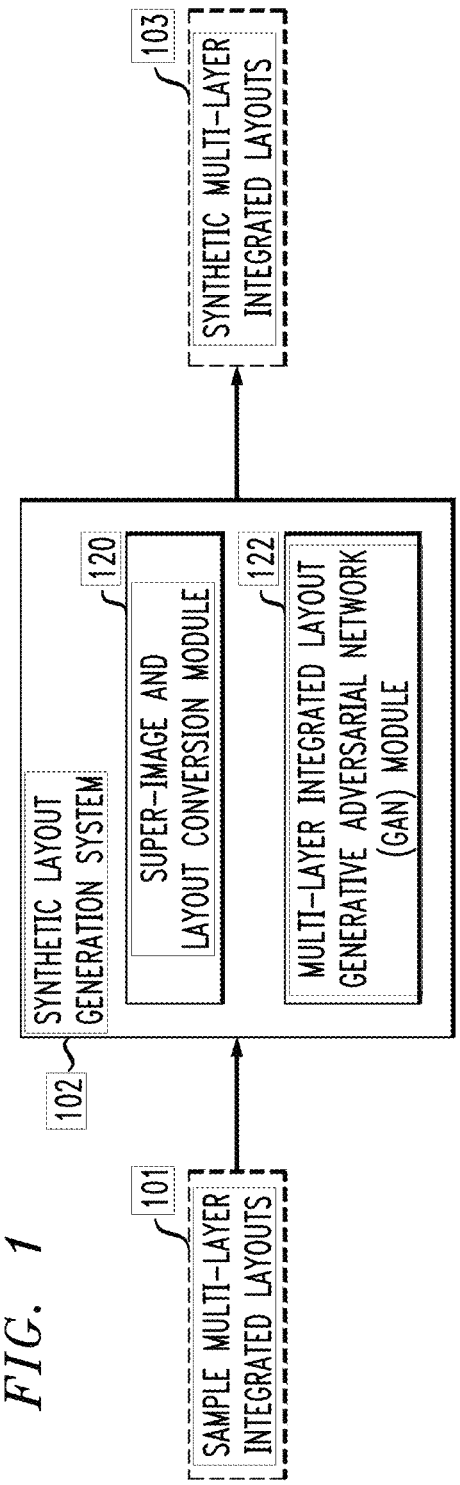
FIG. 1 depicts a system for generating synthetic multi-layer integrated layout patterns, according to an exemplary embodiment of the present invention.

Illustrative embodiments of the invention may be described herein in the context of illustrative methods, systems and devices for generating synthetic multi-layer integrated layout patterns. However, it is to be understood that embodiments of the invention are not limited to the illustrative methods, systems and devices but instead are more broadly applicable to other suitable methods, systems and devices.

As discussed above, determining possible layouts for vias, lines and other features of patterned structures is useful for evaluating manufacturability. Patterned structures include structures formed in semiconductor manufacturing, which may include various materials including but not limited to semiconductors, metals, oxides, etc. in one or more layers. Generating synthetic layout patterns, as an example, can be a crucial part of early stage hot spot and failure mode analysis, especially when real layout data is limited. Synthetic layout patterns are also useful for design space exploration. For example, in conducting a manufacturability study, it is generally desired to have as many design layouts as possible. Multi-layer integrated layout patterns for patterned structures are critical for assessing the manufacturability of integrated layers of a patterned structure. Multi-layer integrated layout patterns are more difficult and time-consuming to generate than single-layer patterns.

In some scenarios, a design manual is defined and provided for design rule check (DRC). Generating synthetic layout designs in such scenarios may involve generating as many DRC-clean or DRC-compliant layout designs as possible to evaluate manufacturability. The design rules may include a variety of rules, such as those relating to geometry of patterned features in different layers, including features that connect layers of a multi-layer integrated structure. Such geometric rules may include rules specifying polygon or other shape parameters for patterned features, minimum and/or maximum spaces between polygons, rectangles and other shapes of such patterned features, etc. In some embodiments, the design rule checks include removing non-Manhattan shapes (e.g., shapes that do not comply with Manhattan distance geometry), design rule violating polygons, etc.

In other scenarios, only limited real physical design layout data is provided as input. Generating synthetic layout patterns in such scenarios may include generating layout patterns that look similar to but are not the same as the input or real data, so as to expand a layout pattern library, evaluate manufacturability, etc. It should be appreciated that some embodiments may combine these and other scenarios.

One way to generate layouts is to use Electronic Design Automation (EDA) tools or other software. Such tools and software, however, are generally limited in that pattern generation is based on predefined building blocks and hard-coded rules to generate reasonable layout patterns. It is very cumbersome, however, to generate integrated layout patterns for multi-layer patterned structures using EDA tools and software, and it is extremely difficult to use such tools and software to generate integrated layout patterns with more than two layers.

Another way to generate layouts is through manual scripting and polygon maneuvering by human pattern designers. Such approaches, however, are limited by the designers' understanding of layouts and are limited in generating large-scale synthetic data even for single-layer layouts, let alone multi-layer integrated layouts. These and other approaches require significant manual effort (e.g., human manipulations), which is error prone and has limited scalability.

Embodiments provide techniques for generating synthetic multi-layer integrated physical design layout patterns that overcome these and other disadvantages, through building a model based on generative adversarial networks (GANs). Such a model may be used to automatically generate, in any scale, synthetic multi-layer integrated physical design layout patterns that look like real or input layout patterns thus expanding pattern libraries. In some embodiments, physical design layouts may be converted to designated data formats for input to a GAN, and the output data format of the GAN may be converted as desired (e.g., for use in particular EDA software) as described in further detail below.

Advantageously, GANs are used in some embodiments to produce realistic multi-layer integrated physical design layout patterns, as GANs can produce synthetic data that looks like real data. Embodiments also provide advantages through automation, which removes the need for human intervention in inference (e.g., generation of synthetic data) after training the GAN model. GAN models used in some embodiments further provide scalability, as trained GANs can generate new patterns quickly. The use of a GAN model further provides for cumulative learning, in that the GAN model becomes more versatile with more diverse real data as training input. GAN models described herein may find use in various application areas, such as for EDA, semiconductor foundries, etc.

GANs are a type of neural network that includes two networks, a generator (generative) network and a discriminator (adversarial) network. The generator network takes random input values and transforms them into a desired output, such as a synthetic multi-layer integrated layout pattern. A synthetic multi-layer integrated layout pattern in some embodiments takes the form of a layout "super-image" described in further detail below.

The discriminator network distinguishes between real and synthetic data, or between real and synthetic integrated multi-layer layout patterns. After training the generator and discriminator networks competitively, neither network should be able to make further progress against the other. In other words, at the end of training the generator network becomes so good that the discriminator network cannot distinguish between the synthetic multi-layer integrated layout patterns and the real multi-layer integrated layout patterns. During inference, the generator network can be used as a standalone model to generate new synthetic multi-layer integrated layout patterns, which will be similar to real or input multi-layer integrated layout patterns.

Embodiments provide for data preparation such that multi-layer integrated layout patterns may be input to a GAN. In some embodiments, the input for a GAN is a set of three-dimensional (3D) arrays corresponding to layout images stacked in a third dimension. Each of the stacked images is a specific layer of a multi-layer integrated layout pattern (e.g., the layout captured in a field of view (FOV)). Since an image may be represented as a two-dimensional (2D) array of numbers, a 3D array representing the multi-layer integrated layout pattern is constructed by stacking multiple layout images (e.g., 2D arrays) of the integrated layout pattern in the third dimension, which corresponds to the number of integrated layers. Digital images may have only three (e.g., red, green and blue or RGB) or four (e.g., cyan, magenta, yellow and key or CMYK) channels (e.g., in the third dimension, with image width and height being the other two dimensions). The 3D arrays constructed in some embodiments, also referred to herein as layout "super-images," can go beyond these channel limitations of digital images. The number of integrated layers can be as many or as few as desired.

FIG. 1 shows a system 102 for generating synthetic integrated multi-layer layout patterns. The system 102 includes a super-image and layout conversion module 120, also referred to as a conversion module 120. As will be described in further detail herein, the conversion module 120 can convert between layout "super-images" and multi-layer integrated layout patterns in layout formats. During training of a GAN, the conversion module 120 may convert input or sample multi-layer integrated layouts 101 into layout "super-images" or 3D arrays that are provided to the discriminator network of the GAN. During inference, layout "super-images" or 3D arrays that are produced by the generator network of the GAN are converted by conversion module 120 to multi-layer integrated layout patterns in a desired layout format to provide synthetic multi-layer integrated layout pattern arrays 103 as output. Each multi-layer integrated layout pattern may be for a particular FOV. A whole layout may be divided into many FOVs.

The conversion module 120 provides appropriately formatted or converted multi-layer integrated layout patterns to the multi-layer integrated layout GAN module 122. The multi-layer integrated layout GAN module 122 may be trained on the input (e.g., the multi-layer integrated layout patterns produced from the sample multi-layer integrated layouts 101 by the conversion module 120). After training, the multi-layer integrated layout GAN module 122 uses the generator network to generate synthetic multi-layer integrated layouts 103 as output. In some embodiments, the synthetic multi-layer integrated layouts 103 are provided in a desired format as described in further detail below, such as via conversion using the conversion module 120. Thus, the output of the multi-layer integrated layout GAN module 122 may be provided back to the conversion module 120 for conversion to a desired layout pattern format.

Figure 2:
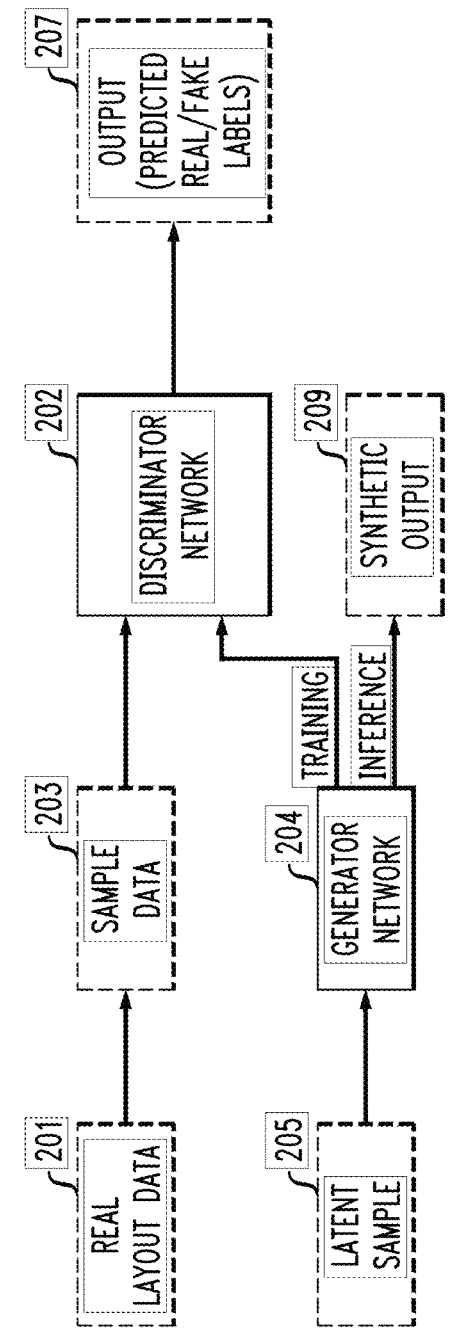
FIG. 2 depicts a workflow of a generative adversarial neural network, according to an exemplary embodiment of the present invention.

FIG. 2 shows an example workflow of using a GAN 200, which includes a discriminator network 202 and a generator network 204. Real layout data 201 is provided as input, which may be converted into sample data 203 prior to being provided to the discriminator network 202. The conversion of input, such as layout files to layout "super-images" described herein, is an example of conversion from real data 201 to sample data 203. Latent sample data 205, which may take the form of randomly-generated information (e.g., a noise vector) is provided to the generator network 204.

The generator network 204, during training, provides generated or synthetic data to the discriminator network 202. The discriminator network 202 is trained to output predicted labels 207, i.e. "real" (e.g., sample data 203) and "fake" (e.g., synthetic data from the generator network 202).

After training, the concept of the GAN is that the generator network 204 will become so good at generating synthetic data that the discriminator network 202 will not be able to distinguish between the sample data 203 and the synthetic data from the generator network 204. Thus, during inference the trained generator network 204 produces synthetic output 209 that is not distinguishable from the real layout data 201 from the perspective of the discriminator network 202.

Figure 3:
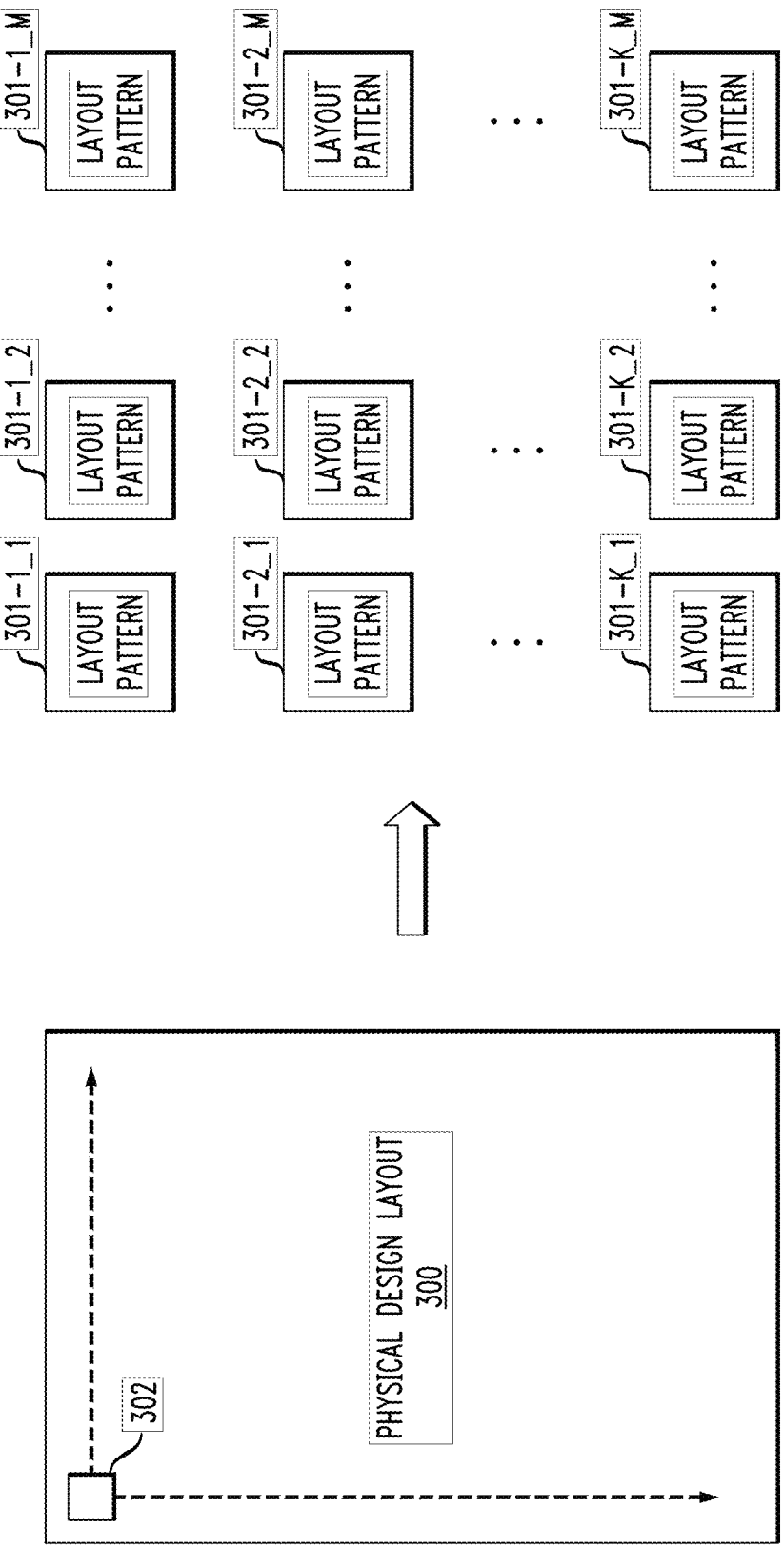
FIG. 3 depicts multi-layer integrated layout patterns clipped from a physical design layout, according to an exemplary embodiment of the present invention.

FIG. 3 illustrates capture of layout patterns from a physical design layout 300. FIG. 3 shows a top-down view of a physical design layout 300, as well as a number of multi-layer integrated layout patterns 301 captured therefrom. The multi-layer integrated layout patterns 301 are clipped out at different locations of the physical design layout 300 in a FOV 302. As shown, there are K rows and M columns of multi-layer integrated layout patterns 301 clipped from the physical design layout 300.

Figure 4:
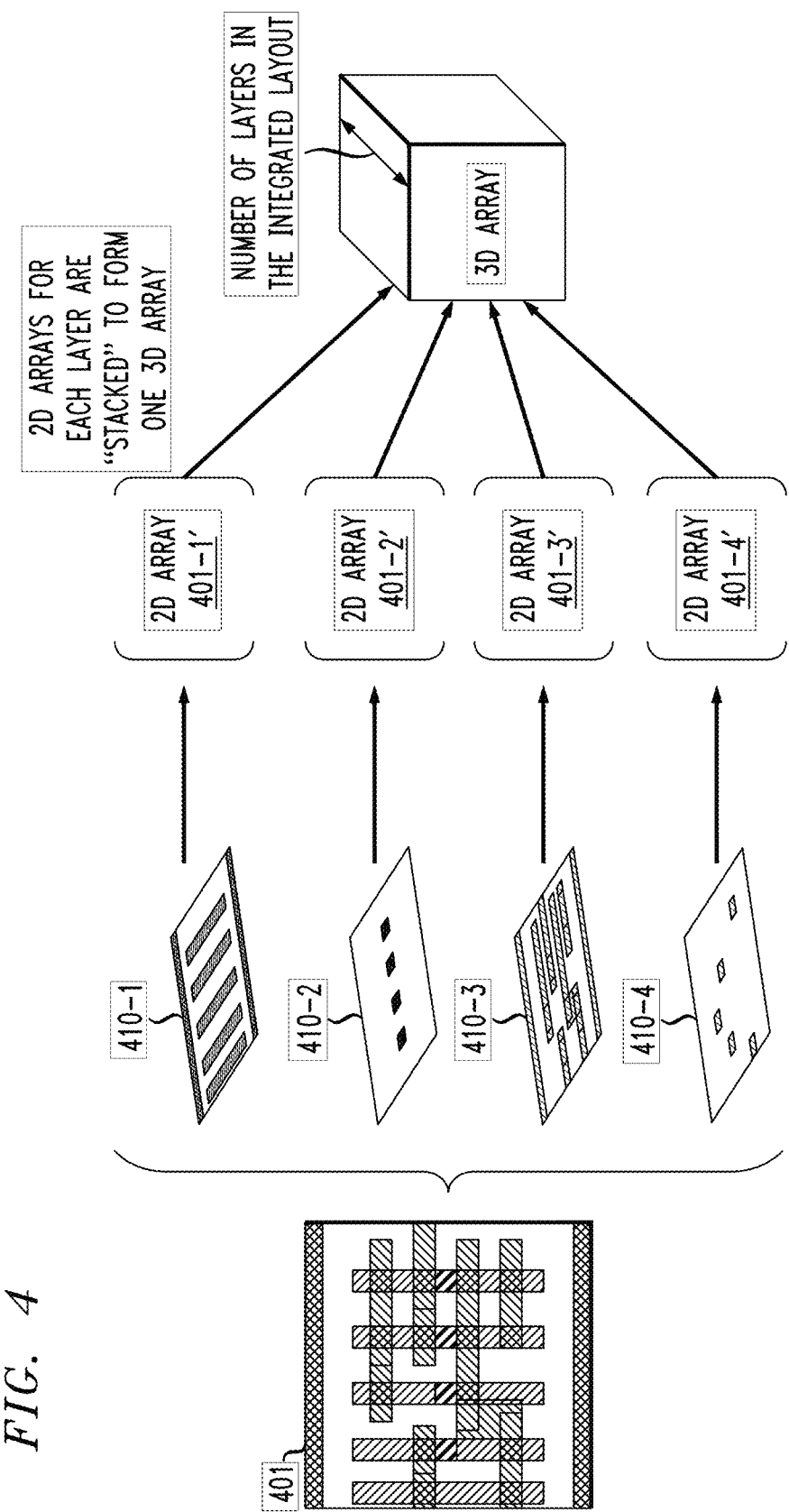
FIG. 4 depicts conversion of a multi-layer integrated layout pattern to a layout super-image, according to an exemplary embodiment of the present invention.

FIG. 4 shows an example conversion of a multi-layer integrated layout pattern 401 to a layout "super-image" or 3D array 403. The multi-layer integrated layout pattern 401 may be obtained from a larger physical design layout as described above with respect to FIG. 3. The multi-layer integrated layout pattern 401 includes layers 410-1, 410-2, 410-3 and 410-4 (collectively, layers 410). The layers 410-1 and 410-3 may be metal layers illustrating metal features of a patterned structure, while layers 410-2 and 410-4 may show vias that interconnect metal features of the metal layers 410-1 and 410-3. In some embodiments, it is desired for the GAN model to capture the correlation between the different layers of an integrated multi-layer layout pattern (e.g., between features of the different layers of a multi-layer patterned structure).

This may be viewed as similar in some respects to training a deep learning model with color images separated into red, green and blue channels, where the deep learning network captures correlations between the red, green and blue channels of the color image. By considering a single layer of a multi-layer integrated layout pattern as a channel, the multi-layer integrated layout pattern may be viewed as a "super-image" with multiple "channels" of correlated layers. Unlike color images, however, the number of "channels" for a multi-layer integrated layout pattern is not limited to three—a multi-layer integrated layout pattern may include fewer or greater than three layers.

In some embodiments, each "channel" or layer of a multi-layer integrated layout pattern is considered as W×H×1 (width by height by "channel" or layer) in dimension and thus may be represented by a 2D array of elements (e.g., a W×H 2D array). Each element of the 2D array may have a binary value (e.g., 0 or 1), representing the presence or absence of a particular feature. In some embodiments, each element of the 2D array need not be binary and instead may be a value in some continuous range. Thus, metal layer 410-1 of layout pattern 401 may be represented as a 2D array of elements 410-1', where 1 denotes presence of metal and 0 denotes absence of metal. Similarly, via layer 410-2 of layout pattern 401 may be represented as a 2D array of elements 410-2', where 1 denotes presence of a via and 0 denotes absence of a via. It should be noted that other layers of a multi-layer patterned structure may include other types of features. For example, metal and via features may be part of back-end-of-line (BEOL) layers. Other features may be present in front-end-of-line (FEOL) layers, such as active areas, poly, etc.

The multi-layer integrated layout pattern 401 may thus be represented as a collection of 2D arrays 410', or as a 3D array 403 of size W×H×4, as there are 4 layers in the layout pattern 401. In some embodiments, the multi-layer integrated layout pattern 401 is in a layout format of a particular EDA software. The EDA software may utilize colors for different features for visualization purposes, shown as grayscale in the layers 410 in FIG. 4. In some embodiments, however, the actual information for each layer 410 (e.g., the presence or absence of metal features in layer 410-1) can be represented as a black and white image. Such black and white images may be transformed into the 2D arrays 410'. Each 2D array 410 may include binary values, such as 0 for black and 1 for white in the black and white representations of layers 410. The 2D arrays 410' are "stacked" or combined to form the 3D array 403. In this manner, input multi-layer integrated layout pattern 401 is converted to a 3D array 403 for input to a GAN.

It should be appreciated that single-layer pattern images are not limited to being black and white images, or to being represented as 2D arrays of binary values. The single-layer pattern images may be color images, grayscale images, etc., and the 2D arrays may include, for example, continuous values. In some embodiments, the input to the GAN (e.g., the training data) are binary arrays, but the generated output arrays (e.g., the synthetic data) contains continuous numbers. Thresholds may be applied during post-processing to make the continuous values binary before conversion to a desired layout format.

Figure 5:
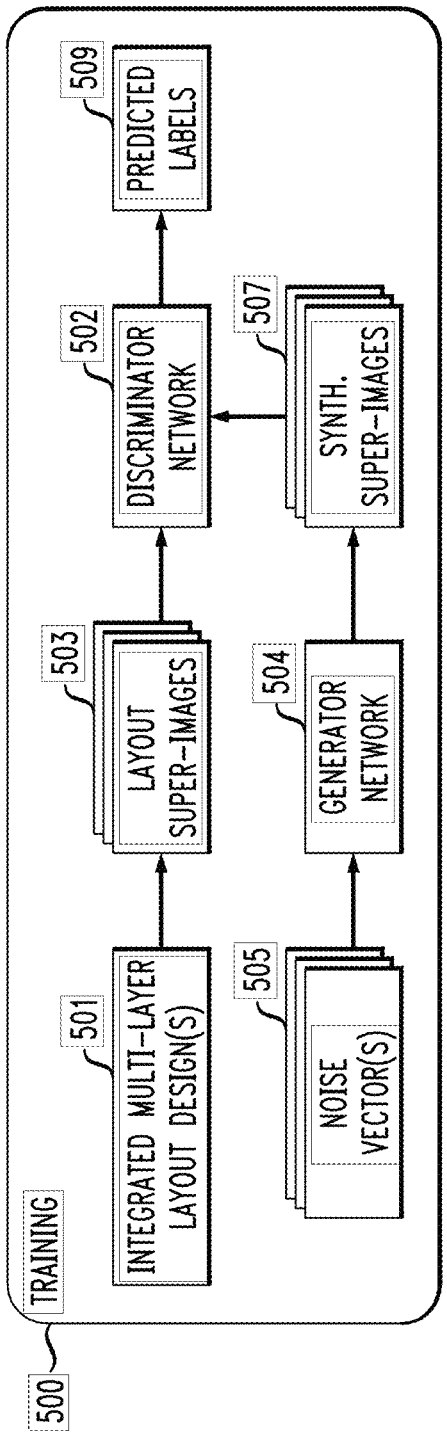
FIG. 5 depicts a training workflow of a generative adversarial neural network, according to an exemplary embodiment of the present invention.

FIG. 5 shows a more detailed view of a training workflow 500 of a GAN. During training, existing multi-layer integrated layout designs 501 are provided as the input or real data, and are converted to layout pattern "super-images" 503 suitable for processing by discriminator network 502, such as using the techniques described above with respect to FIG. 4. Noise vectors 505 are provided to generator network 504, which generates synthetic "super-images" 507 provided to the discriminator network 502. The discriminator network 502 outputs predicted labels 509 for the layout "super-images" 503 and the synthetic "super-images" 507 (e.g., indicating whether the discriminator network 502 views respective ones of each as "real" or "fake"). The discriminator network 502 and generator network 504 are optimized simultaneously, until the discriminator network 502 is unable to distinguish between the "real" and "fake" data, or between the layout "super-images" 503 and the synthetic "super-images" 507.

It should be noted that optimizing or tuning the GAN comprising discriminator network 502 and generator network 504, unlike other types of neural network architectures, is not necessarily limited to using a single accuracy or performance target for optimization. Instead, in some embodiments optimizing the discriminator network 502 and generator network 504 of the GAN seeks to achieve a balance between performance of the discriminator network 502 and generator network 504. In some embodiments, "optimization" or the discriminator network 502 not being able to distinguish between "real" and "fake" data may be subject to some threshold level of accuracy in the predicted labels 509, and is not meant to imply that after training the discriminator network 502 is never able to successfully recognize that one or more of the synthetic "super-images" 507 produced by generator network 504 is "fake."

Figure 6:
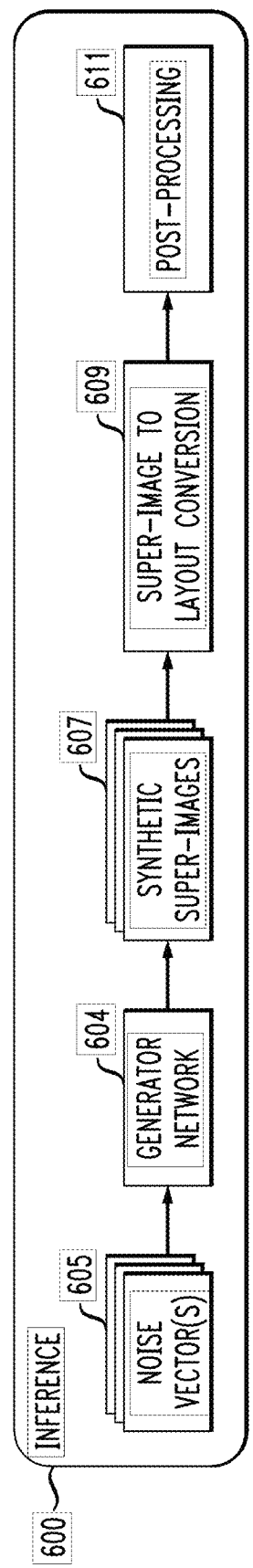
FIG. 6 depicts an inference workflow using a trained generative adversarial neural network, according to an exemplary embodiment of the present invention.

FIG. 6 shows a more detailed view of an inference workflow 600 using a trained GAN, or more particularly the trained generator network 604 of a GAN. Similar to the training workflow 500 described above, noise vectors 605 are provided to the generator network 604, which generates synthetic "super-images" 607. The synthetic "super-images" 607 produced during inference 600, however, are not compared against real data by a discriminator network as it is assumed that the trained generator network 604 is good enough to "fool" the discriminator network of the GAN and thus there is no need to pass the synthetic "super-images" 607 to the discriminator network. Instead, the synthetic "super-images" 607 are converted 609 from the synthetic "super-images" 607 to a desired layout format. In some embodiments, the conversion 609 of the synthetic "super-images" 607 is from a 3D array to an Open Artwork System Interchange Standard (OASIS) format (.oas) or Graphic Database System (GDS) format (.gds) as desired. The input data, before conversion, may also be in the OASIS or GDS layout design format.

Post-processing 611 may include polygon post-processing and DRC. The polygon post-processing may include removing or correcting non-Manhattan shapes (e.g., shapes having edges not parallel to x- and y-axes) in an output layout pattern. As mentioned above, the post-processing may further include converting continuous values of the synthetic "super-images" or 3D arrays to binary values prior to conversion to the layout format. DRC during post-processing 611 ensures that the synthetic layout patterns meet specified design rules for layout patterns in a particular use case that may not be captured during training.

Figure 7:
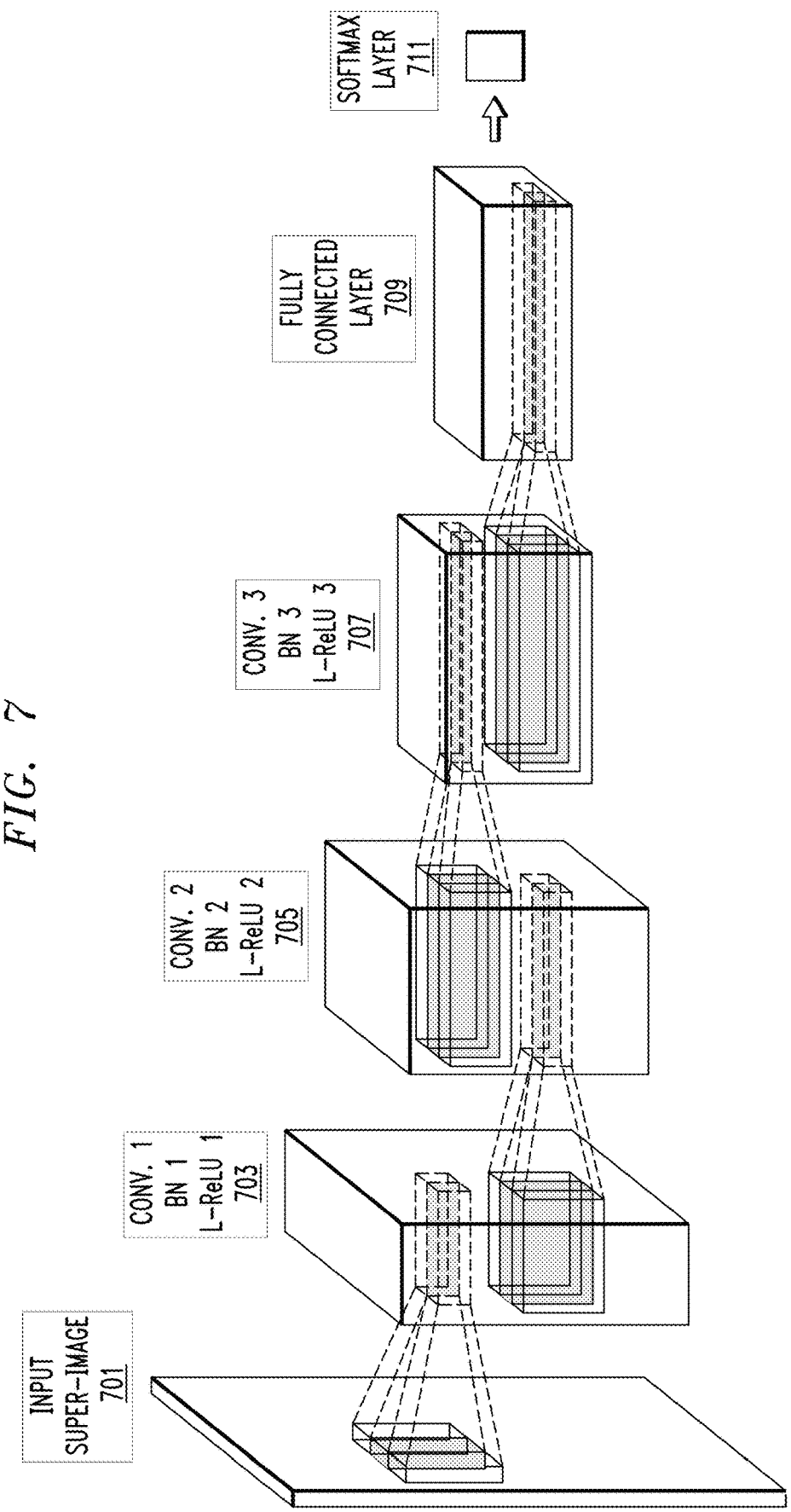
FIG. 7 depicts an architecture of a discriminator network of a generative adversarial neural network, according to an exemplary embodiment of the present invention.

FIG. 7 shows an architecture of a discriminator network of a GAN. The discriminator network in the FIG. 7 example is implemented as a convolutional neural network (CNN). It should be appreciated, however, that various other architectures for the discriminator network of a GAN may be used in other embodiments, including but not limited to fully connected neural networks, recurrent neural networks (RNNs), etc.

The discriminator network includes an input layer 701 which provides a layout "super-image" as described herein. The discriminator network also includes a series of layers 703, 705 and 707. Each of the layers 703, 705 and 707 more particularly includes a convolutional (CONV.) layer, batch normalization (BN) and leaky-rectified linear unit (L-ReLU) activation function as shown. The discriminator network further includes a fully connected (FC) layer 709 and a softmax layer 711. The softmax layer 711 provides an output (e.g., 0 or 1) indicating whether the input layout "super-image" 701 is determined to be "fake" (e.g., output 0) or "real" (e.g., output 1).

Figure 8:
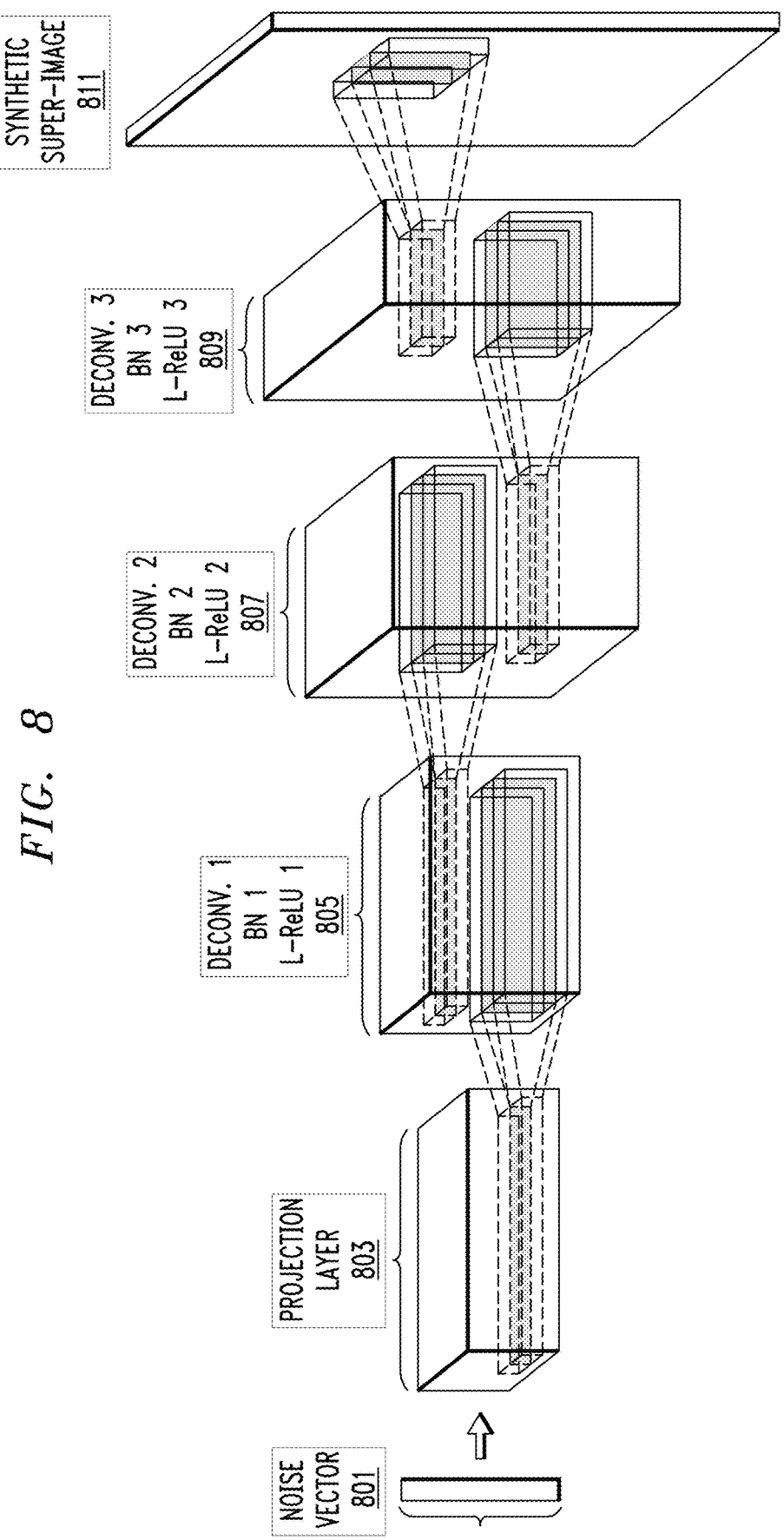
FIG. 8 depicts an architecture of a generator network of a generative adversarial neural network, according to an embodiment of the present invention.

FIG. 8 shows an architecture of a generator network of a GAN. The generator network in the FIG. 8 example is implemented as a CNN. It should be appreciated, however, that various other architectures for the generator network of a GAN may be used in other embodiments, including but not limited to fully connected neural networks, RNNs, etc.

The generator network includes an input layer 801 which provides a noise vector as described herein. The generator network also includes a projection layer 803 and a series of layers 805, 807 and 809. Each of the layers 805, 807 and 809 more particularly includes a deconvolutional (DECONV.) layer, batch normalization (BN) and L-ReLU activation function as shown. The generator network further includes an output layer 811, which outputs a synthetic layout "super-image."

It should be noted that the particular architectures shown in FIGS. 7 and 8 are presented by way of example only, and that embodiments are not limited to use of the specific examples shown for the discriminator network (FIG. 7) and generator network (FIG. 8). Hyperparameters (e.g., number of neural network layers, type of neural network layers, numbers of neurons for each neural network layer, numbers and sizes of filters, etc.) for GANs (e.g., the discriminator and generator neural networks thereof) can vary as desired. In some embodiments, the particular values for the hyperparameters are based on factors such as the input multi-layer integrated layout patterns, training accuracy targets, available computing hardware, etc.

In some embodiments, physical design layouts (which may be in an OASIS or GDS format) with a variety of multi-layer integrated layout patterns are selected for training the GAN. The multi-layer integrated layout patterns are converted into a set of layout "super-images" for input to the GAN as training data. In some embodiments, the GAN is built using Python and Tensorflow, an open-source deep learning library. The GAN is then trained using the training data, with fine-tuning of the hyperparameters of the GAN (e.g., the discriminator and generator networks thereof) to achieve desired results. After training, the generator network of the GAN is used to generate synthetic layout "super-images" which may be converted to multi-layer integrated layout patterns in a desired layout format (e.g., the OASIS or GDS format).

Various conversion techniques may be utilized for converting between a physical design layout and layout "super-images" or 3D arrays described herein. As described above, the output of the generator network of a GAN may be in layout "super-image" format, such as a 3D array of values denoting presence or absence of features in different layers of multi-layer integrated layout pattern. Layout pattern formats such as the GDS format, however, are in the form of polygon coordinates. The 3D array output by the generator network of the GAN (e.g., a synthetic layout "super-image") may be converted into a layout pattern in a layout format such as GDS and OASIS by programming scripts. Similarly, layout patterns in the layout format may be converted to 3D arrays or layout "super-images" as described herein.

Figure 9:
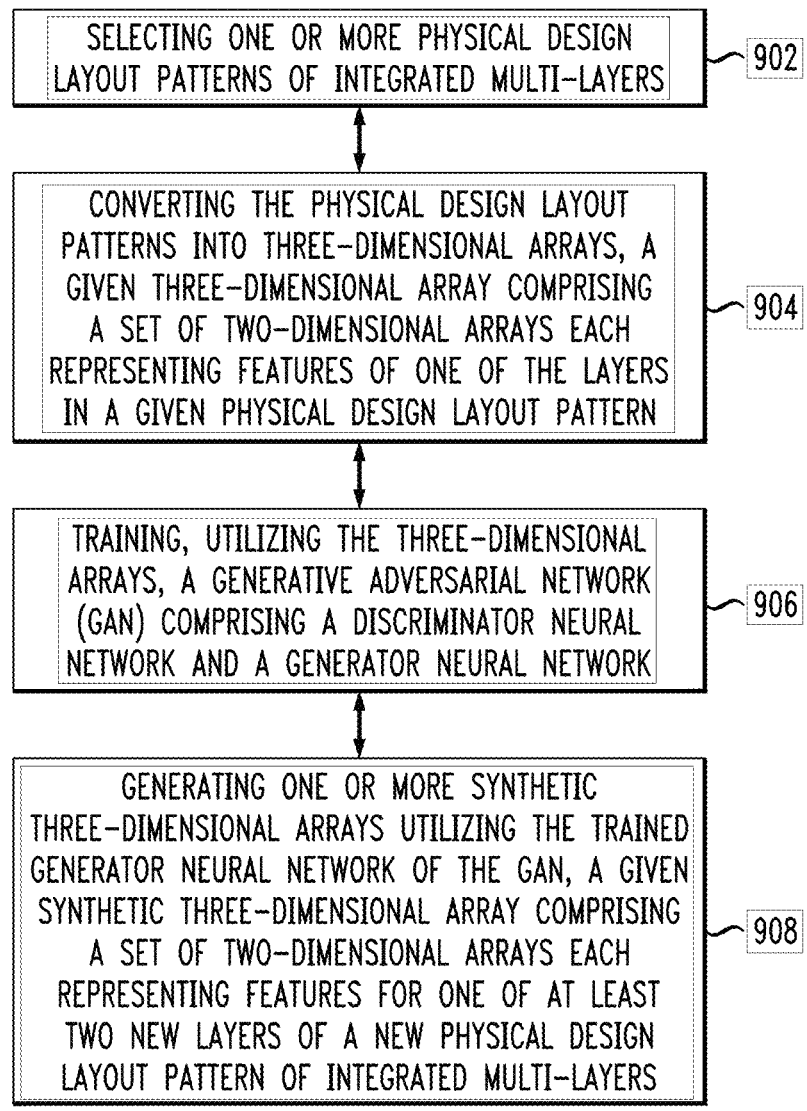
FIG. 9 depicts a workflow for generating synthetic multi-layer integrated layout patterns, according to an exemplary embodiment of the present invention.

FIG. 9 shows a workflow 900 for generating physical design layout patterns of integrated multi-layers. The workflow 900 begins with step 902, selecting one or more physical design layout patterns of integrated multi-layers as training data. Each layout pattern may include multiple layers of a given patterned structure, with different features in the different layers. The features may include, by way of example, vias in a first layer of the given patterned structure, metal lines in a second layer of the given patterned structure, etc. The physical design layout patterns may provide portions of an overall physical design layout of integrated multi-layers. The physical design layout patterns selected in step 902 include existing or known physical design layout patterns.

In step 904, the physical design layout patterns of integrated multi-layers are converted into 3D arrays. Each of the 3D arrays comprises a set of 2D arrays, where each 2D array represents features of one of the layers in a given one of the physical design layout patterns of integrated multi-layers. Each of the three dimensional arrays may have a size of W×H×N, where W represents a width of the FOV, H represents a height of the field of view, and N represents the number of layers the physical design layout pattern of integrated multi-layers. The value of N in some embodiments is 3, corresponding to a three-layered patterned structure. In other embodiments, the value of N may be greater than 3. Entries of the 3D arrays may comprise values indicating presence of a given feature at respective positions in the FOV for a corresponding layer of the given physical design layout pattern of integrated multi-layers.

Step 904 in some embodiments includes, for a given physical design layout pattern of integrated multi-layers, capturing an image of each individual layer of the given physical design layout pattern of integrated multi-layers, converting the image of each individual layer into an array of size W×H×1, and generating the given 3D array of size of W×H×N as a combination of N arrays of size W×H×1 for each individual layer of the given physical design layout pattern of integrated multi-layers.

In step 906, a GAN is trained utilizing the 3D arrays produced in step 904. The GAN includes a discriminator neural network and a generator neural network. The discriminator neural network may comprise a CNN. The CNN may include an input layer, a series of one or more convolutional layers, batch normalization and a leaky rectified linear unit (L-ReLU) activation functions, a fully connected layer, and a softmax output layer. The 3D arrays produced in step 904 are provided to the input layer of the CNN. The generator neural network may comprise an input layer, a projection layer, a series of deconvolutional layers and an output layer. The input layer of the generator neural network receives a noise vector, and the output layer of the generator neural network provides synthetic 3D arrays.

In step 908, one or more synthetic 3D arrays are generated utilizing the trained generator neural network of the GAN. The synthetic 3D arrays each comprise a set of 2D arrays, where each 2D array represents features for one of at least two new layers of a new physical design layout pattern of integrated multi-layers.

In some embodiments, one or more of the physical design layout patterns selected in step 902 are in a layout formed supported by an EDA software (e.g., in a GDS or OASIS format). The layout format may comprise coordinates of polygons representing features in the layers of the physical design layout patterns. The conversion in step 904 may thus include converting the layout format of each layer of the physical design layout pattern of integrated multi-layers to a 2D array, and structuring the 2D arrays into a 3D array of values, the values representing presence of designated features at locations in each of the layers of the physical design layout pattern of integrated multi-layers.

In some embodiments, the synthetic 3D arrays produced in step 908 are converted to a layout format supported by an EDA software (e.g., a GDS or OASIS format). Converting the synthetic 3D arrays to the layout format supported by the EDA software may comprise, for a given synthetic 3D array comprising a set of 2D arrays each representing a layer of the new physical design layout pattern of integrated multi-layers, translating each of the 2D arrays to coordinates of vertices of polygons of features in a corresponding layer of the new physical design layout pattern of integrated multi-layers. Post-processing may be applied to the synthetic 3D arrays converted into the layout format. Such post-processing may include using DRC, removing rule-violating shapes, etc. The synthetic 3D arrays converted to the layout format may be utilized to evaluate manufacturability of new physical design layout patterns of integrated multi-layers.

Embodiments of the present invention include a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
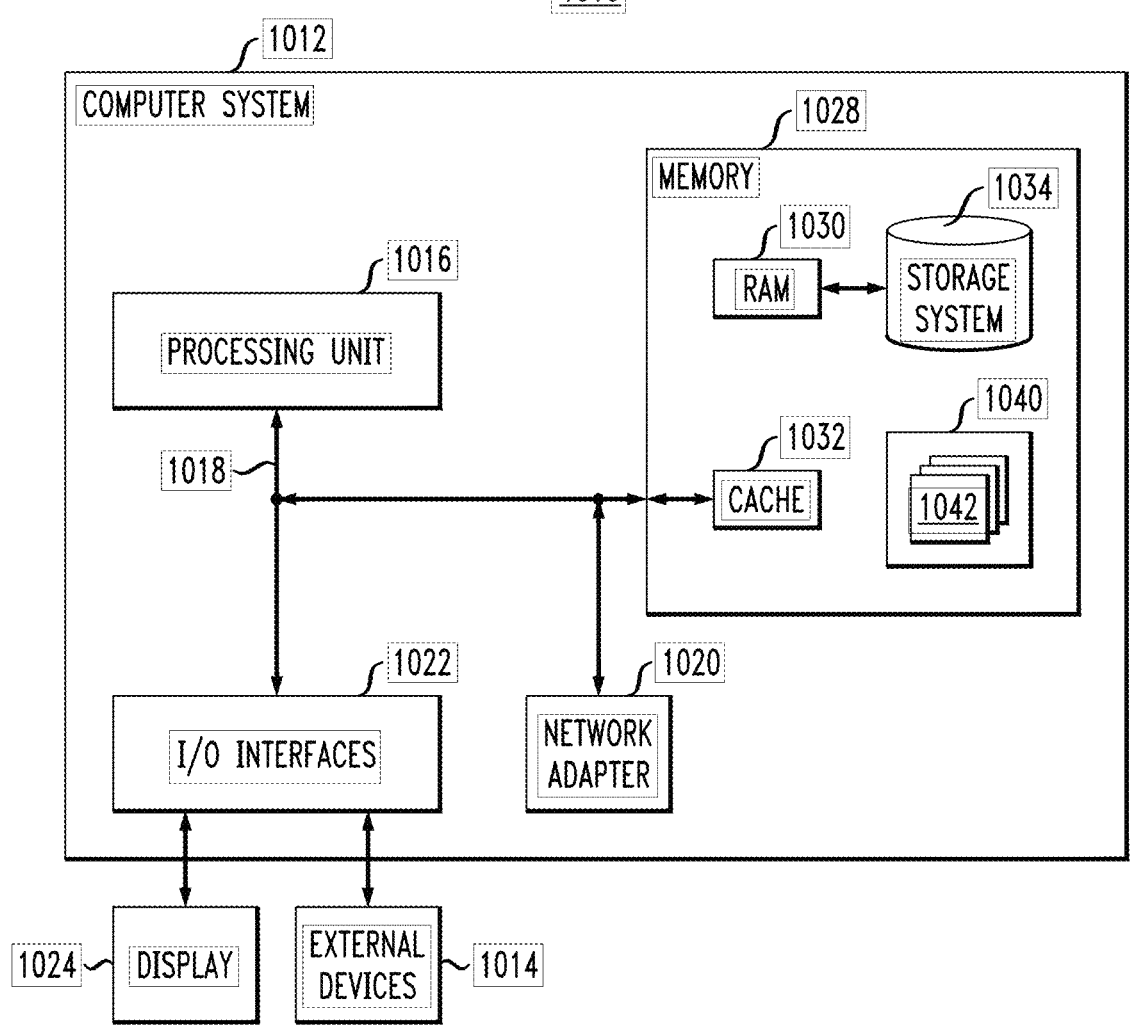
FIG. 10 depicts a computer system in accordance with which one or more components/steps of techniques of the invention may be implemented, according to an exemplary embodiment of the invention.

One or more embodiments can make use of software running on a general-purpose computer or workstation. With reference to FIG. 10, in a computing node 1010 there is a computer system/server 1012, which is operational with numerous other general purpose or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 1012 in computing node 1010 is shown in the form of a general-purpose computing device. The components of computer system/server 1012 may include, but are not limited to, one or more processors or processing units 1016, a system memory 1028, and a bus 1018 that couples various system components including system memory 1028 to processor 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as random access memory (RAM) 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1018 by one or more data media interfaces. As depicted and described herein, the memory 1028 may include at least one program product having a set (e.g., at least one) of program modules that are configured to carry out the functions of embodiments of the invention. A program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the invention as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via I/O interfaces 1022. Still yet, computer system/server 1012 can communicate with one or more networks such as a LAN, a general WAN, and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
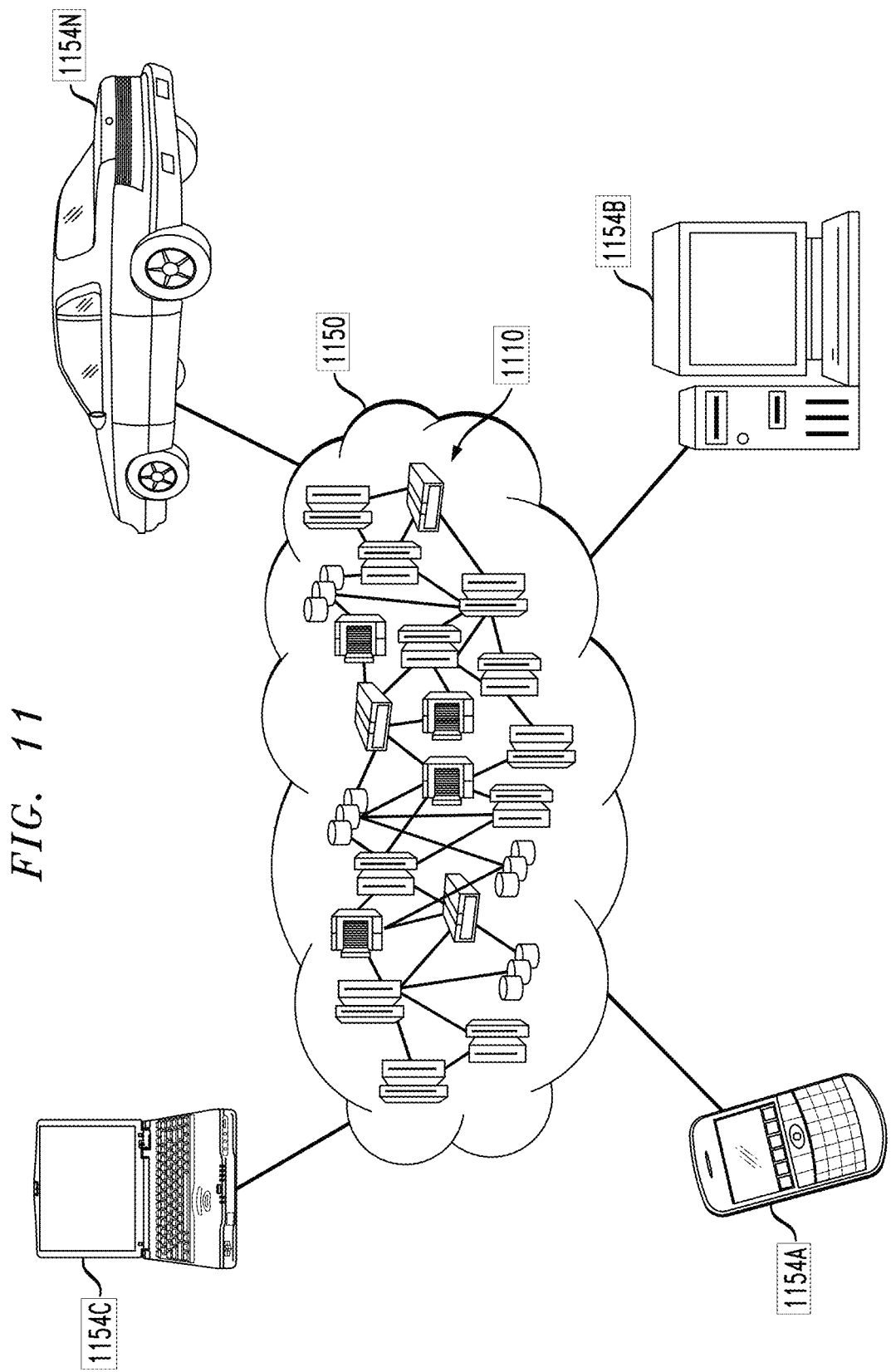
FIG. 11 depicts a cloud computing environment, according to an exemplary embodiment of the present invention.

Referring now to FIG. 11, illustrative cloud computing environment 1150 is depicted. As shown, cloud computing environment 1150 includes one or more cloud computing nodes 1110 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1110 may communicate with one another. They may be grouped (not shown) physically or virtually, in one or more networks, such as Private, Community, Public, or Hybrid clouds as described hereinabove, or a combination thereof. This allows cloud computing environment 1350 to offer infrastructure, platforms and/or software as services for which a cloud consumer does not need to maintain resources on a local computing device. It is understood that the types of computing devices 1154A-N shown in FIG. 11 are intended to be illustrative only and that computing nodes 1110 and cloud computing environment 1150 can communicate with any type of computerized device over any type of network and/or network addressable connection (e.g., using a web browser).

Figure 12:
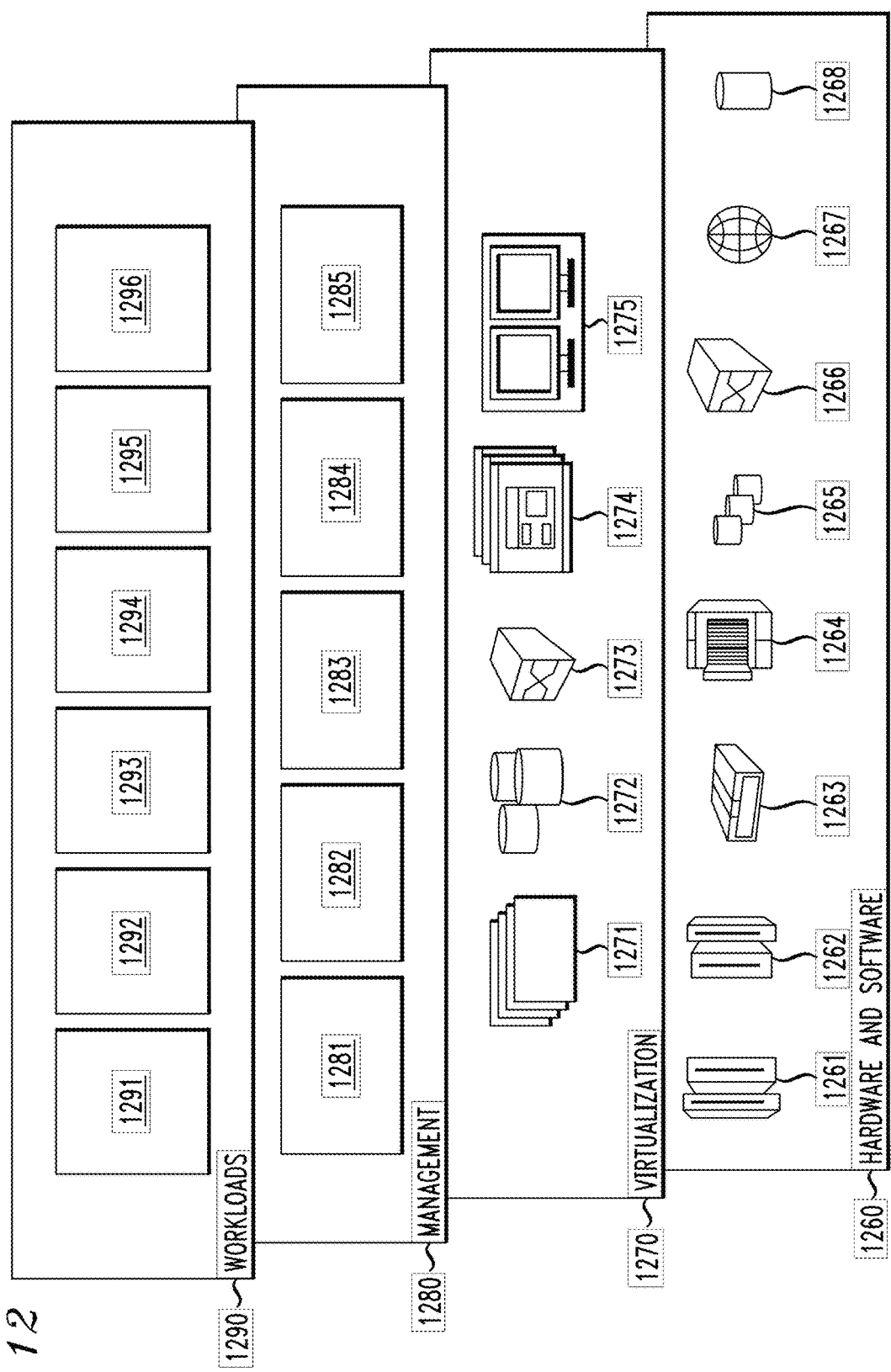
FIG. 12 depicts abstraction model layers, according to an exemplary embodiment of the present invention.

Referring now to FIG. 12, a set of functional abstraction layers provided by cloud computing environment 1150 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 1260 includes hardware and software components. Examples of hardware components include: mainframes 1261; RISC (Reduced Instruction Set Computer) architecture based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from this layer include: mapping and navigation 1291; software development and lifecycle management 1292; virtual classroom education delivery 1293; data analytics processing 1294; transaction processing 1295; and synthetic multi-layer integrated layout generation processing 1296, which may perform various functions described above with respect to generating synthetic multi-layer integrated layouts using the techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for generating physical design layout patterns, the method comprising steps of:

selecting as training data one or more physical design layout patterns of integrated multi-layers for features in at least two layers of a given patterned structure;

converting the physical design layout patterns into three-dimensional arrays, a given three-dimensional array comprising a set of two-dimensional arrays each representing features of one layer of the at least two layers in a given one of the physical design layout patterns;

training, utilizing the three-dimensional arrays, a generative adversarial network (GAN) comprising a discriminator neural network and a generator neural network; and generating one or more synthetic three-dimensional arrays utilizing the generator neural network of the trained GAN, a given one of the synthetic three-dimensional arrays comprising a set of two-dimensional arrays each representing features for one new layer of at least two new layers of a new physical design layout pattern;

wherein the method is performed by at least one processing device comprising a processor coupled to a memory.

2. The method of claim 1, wherein the features in at least a first layer of the given patterned structure comprise vias and the features in at least a second layer of the given patterned structure comprise metal lines.

3. The method of claim 1, wherein the given three-dimensional array has a size of W×H×N, where W represents a width of a field of view of the at least two layers of the given physical design layout pattern, H represents a height of the field of view, and N represents a number of layers in the given physical design layout pattern.

4. The method of claim 3, wherein N is 3.

5. The method of claim 3, wherein N is greater than 3.

6. The method of claim 3, wherein entries of the given three-dimensional array comprise values indicating presence of a given feature at respective positions in the field of view for a corresponding layer of the given physical design layout pattern.

7. The method of claim 3, wherein the converting the physical design layout patterns into the three-dimensional arrays comprises, for the given physical design layout pattern:

capturing an image of each individual layer of the given physical design layout pattern;

converting the image of said each individual layer into an array of size W×H×1; and generating the given three-dimensional array of size of W×H×N as a combination of N arrays of size W×H×1 for said each individual layer of the given physical design layout pattern.

8. The method of claim 1, wherein the discriminator neural network comprises a convolutional neural network.

9. The method of claim 8, wherein the convolutional neural network comprises: an input layer; a series of one or more convolutional layers, a batch normalization and a leaky rectified linear unit (L-ReLU) activation functions; a fully connected layer; and a softmax output layer.

10. The method of claim 9, wherein the three-dimensional arrays are provided to the input layer.

11. The method of claim 1, wherein the generator neural network comprises an input layer, a projection layer, a series of deconvolutional layers and an output layer.

12. The method of claim 11, wherein the input layer receives a noise vector and the output layer provides the synthetic three-dimensional arrays.

13. The method of claim 1, wherein a given one of the physical design layout patterns is in a layout format supported by an electronic design automation (EDA) software, the layout format comprising coordinates of polygons representing features in the layers of the given physical design layout pattern.

14. The method of claim 13, wherein the converting the physical design layout patterns into the three-dimensional arrays comprises, for the given physical design layout pattern:

converting the layout format of each layer of layers of the given physical design layout pattern to a two-dimensional array; and structuring the two-dimensional arrays into a three-dimensional array of values, the values representing presence of designated features at locations in said each layer of the layers of the given physical design layout pattern.

15. The method of claim 1, further comprising converting the synthetic three-dimensional arrays to a layout format supported by an electronic design automation (EDA) software.

16. The method of claim 15, wherein the converting the synthetic three-dimensional arrays to the layout format supported by the EDA software comprises, for the given synthetic three-dimensional array comprising a set of two-dimensional arrays each representing a layer of the new physical design layout pattern, translating each of the two-dimensional arrays to coordinates of vertices of polygons of features in a corresponding layer of the new physical design layout pattern.

17. The method of claim 15, further comprising applying a post-processing using one or more design rule checks.

18. The method of claim 15, further comprising applying a post-processing to remove one or more rule-violating shapes.

19. The method of claim 15, further comprising utilizing the synthetic three-dimensional arrays converted to the layout format to evaluate manufacturability of the new physical design layout pattern.

20. A computer program product, the computer program product comprising a non-transitory computer readable storage medium having program instructions embodied therewith, the program instructions executable by at least one computing device to cause the at least one computing device to perform steps of:

selecting as training data one or more physical design layout patterns of integrated multi-layers for features in at least two layers of a given patterned structure;

converting the physical design layout patterns into three-dimensional arrays, a given three-dimensional array comprising a set of two-dimensional arrays each representing features of one layer of the at least two layers in a given one of the physical design layout patterns;

training, utilizing the three-dimensional arrays, a generative adversarial network (GAN) comprising a discriminator neural network and a generator neural network; and generating one or more synthetic three-dimensional arrays utilizing the generator neural network of the trained GAN, a given one of the synthetic three-dimensional arrays comprising a set of two-dimensional arrays each representing features for one new layer of at least two new layers of a new physical design layout pattern.

21. The computer program product of claim 20, wherein the given three-dimensional array has a size of W×H×N, where W represents a width of a field of view of the at least two layers of the given physical design layout pattern, H represents a height of the field of view, and N represents a number of layers in the given physical design layout pattern.

22. The computer program product of claim 21, wherein the converting the physical design layout patterns into the three-dimensional arrays comprises, for the given physical design layout pattern:

capturing an image of each individual layer of the given physical design layout pattern;

converting the image of said each individual layer into an array of size W×H×1; and generating the given three-dimensional array of size of W×H×N as a combination of N arrays of size W×H×1 for said each individual layer of the given physical design layout pattern.

23. An apparatus comprising:

a memory; and at least one processor coupled to the memory and configured for:

selecting one or more physical design layout patterns of integrated multi-layers for features in at least two layers of a given patterned structure;

converting the physical design layout patterns of integrated multi-layers into three-dimensional arrays, a given three-dimensional array comprising a set of two-dimensional arrays each representing features of one layer of the at least two layers in a given one of the physical design layout patterns;

training, utilizing the three-dimensional arrays, a generative adversarial network (GAN) comprising a discriminator neural network and a generator neural network; and generating one or more synthetic three-dimensional arrays utilizing the generator neural network of the trained GAN, a given one of the synthetic three-dimensional arrays comprising a set of two-dimensional arrays each representing features for one new layer of at least two new layers of a new physical design layout pattern.

24. The apparatus of claim 23, wherein the given three-dimensional array has a size of W×H×N, where W represents a width of a field of view of the at least two layers of the given physical design layout pattern, H represents a height of the field of view, and N represents a number of layers in the given physical design layout pattern.

25. The apparatus of claim 24, wherein converting the physical design layout patterns into the three-dimensional arrays comprises, for the given physical design layout pattern:

capturing an image of each individual layer of the given physical design layout pattern;

converting the image of said each individual layer into an array of size W×H×1; and generating the given three-dimensional array of size of W×H×N as a combination of N arrays of size W×H×1 for said each individual layer of the given physical design layout pattern.

* * * * *